SOLID STATE OSCILLATOR HAVING LARGE MICROWAVE OUTPUT

Filed Dec. 4, 1967

INVENTOR
CONRAD LANZA

BY S. P. Tedesco
ATTORNEY

United States Patent Office 3,535,654
Patented Oct. 20, 1970

3,535,654

SOLID STATE OSCILLATOR HAVING LARGE MICROWAVE OUTPUT

Conrad Lanza, Putnam Valley, N.Y., assignor to International Business Machines Corporation, Armonk, N.Y., a corporation of New York Filed Dec. 4, 1967, Ser. No. 687,854
Int. Cl. H03b 7/06
U.S. Cl. 331—107 15 Claims

ABSTRACT OF THE DISCLOSURE

A solid state oscillator of the "Gunn-effect" type comprises capacitive means coupled to the active region of the oscillator for delaying the nucleation, i.e., increasing the nucleation time, of domains so as to increase microwave power output. In the preferred embodiment, the output circuit is capacitively coupled along the space charge region associated with a reversed biased pn junction to a high electric field region, or domain, along the entire active region of the oscillator whereby nearly constant capacitive current flows into the load while a domain is propagating; the nucleation of each subsequent domain is delayed until the capacitance of the space charge region is recharged. The RC time constant for recharging the space charge region is determined to be approximately equal to the domain propagation time whereby an almost square wave, alternating current output waveform is generated in the output circuit.

BACKGROUND OF THE INVENTION

This invention relates to solid state oscillators of the "Gunn-effect" type having a large microwave power output and wherein the nucleation time of successive high electric field regions, or domains, is positively controlled.

Solid state oscillators of the "Gunn-effect" type have attracted widespread attention due to their small size and low cost as compared to other available microwave oscillator arrangements, e.g., klystrons, magnetrons, traveling wave tubes, etc. Essentially, such oscillators comprise a small specimen of particular semiconductive material having a multivalley conduction band system and capable of generating current oscillations in the microwave range when subjected to electric fields in excess of a critical, or threshold, intensity $E_T$. According to the present theory, a high electric field region, or domain, forms within the semiconductive specimen when subjected to electric fields in excess of a critical intensity $E_T$ due to a redistribution of electric fields within the specimen. Such redistribution of electric fields results from a transfer of charge carriers from a high mobility conduction band to a low mobility conduction band under the influence of applied electric fields in excess of the critical intensity $E_T$. A domain, when nucleated, is sustained and propagated along the semiconductive specimen by electric fields greater than a sustaining intensity $E_S$, which is less than the critical intensity $E_T$. The presence of a domain has the effect of reducing the overall conductance of the semiconductive specimen; the magnitude of current flow through the semiconductive specimen varies according to the presence and absence of a domain. Accordingly, a constant voltage of particular magnitude applied across the semiconductive specimen is effective to nucleate and propagate domains in successive, or cyclic, fashion whereby current through such specimen and, hence, along a series-connected load varies periodically in the form of coherent current oscillations. The theory of the "Gunn-effect" has been described more fully in "Theory of Negative-Conductance Amplification and of Gunn Instabilities in 'Two-Valley' Semiconductor" by D. E. McCumber et al., IEEE Transactions of Electron Devices, vol. ED–13, No. 1, January 1966.

The frequency of current oscillations generated by oscillators of the "Gunn-effect" type operated in the traveling domain, or transit-time, mode depends upon the propagation distance L and propagation velocity $v$ of the domains along the active region, i.e., $L/v$, where $v$ is about $10^7$ cm./sec. The ability to produce such oscillators capable of generating current oscillations of a given frequency was not easily obtained since precise tailoring of the length of the active region was required. The active region of such oscillators has been in the order of $2\times10^{-3}$ cm. Also, the usual technique for extracting microwave power was to connect the load in series with the active region, i.e., the current path along which domains are propagated. Generally, the current oscillations took the form of a series of sharp current spikes, the time duration between successive spikes being dependent upon the propagation distance L of the domains along the active region. On the other hand, the duration of the individual current spikes was determined by the time required for a domain to pass out of the active layer and for a subsequent domain to be nucleated. Since the nucleation time of a domain is extremely short, the current waveform comprised vary narrow current spikes separated by relatively long time intervals. Obviously, such output waveform contains low total microwave power distributed into many harmonics. Such low total microwave power results due to the dependence of the frequency of current oscillations upon the propagation length L and the inability to control the nucleation time of domains.

To increase microwave power output, the prior art has sought to avoid the dependence of the frequency of current oscillations upon the propagation length L, i.e., length of the active region, so as to reduce the time interval between successive domains and increase frequency. Prior art efforts have not been directed to controlling the nucleation time of domains in the active regions of the "Gunn-effect" type oscillators. Such prior art efforts, for example, have included the use of resonant cavities to extinguish successive domains at an intermediate portion of the active region, as described in patent application, Ser. No. 524,406, entitled "Microwave Oscillator" by J. B. Gunn; the use of auxiliary electrodes or varying the inpurity-cross section product of the active region to nucleate successive domains at an intermediate portion of the active region, as described in patent application, Ser. No. 374,758, entitled "Electric Field-Responsive Solid State Devices" by J. B. Gunn; and the use of nonsymmetrical cathode and anode contacts for establishing an electric field gradient in the active region to extinguish successive domains at an intermediate portion of such region, as described in patent application, Ser. No. 609,031, entitled "Electric Field-Responsive Solid State Device" by C. Lanza. Such prior art attempts, however, have not been effective to control the nucleation time of a domain but, rather, have relied solely upon the properties of the semiconductive specimen forming the active region. While microwave power output has been increased, it has not been optimized. The problem of power output of such oscillators can be advanced if the duration of the current change in the load due to the presence of a domain along the active region and, also, the time interval between such changes can be positively controlled; in such event, an almost-square wave alternating current waveform is generated across the load.

Accordingly, an object of this invention is to provide a solid state oscillator of the "Gunn-effect" type having a large microwave power output.

Another object of this invention is to provide a solid state oscillator of the "Gunn-effect" type for generating an almost-square wave alternating current waveform.

Another object of this invention is to provide structure for the amplitude modulation of the output signals of solid state oscillators of the "Gunn-effect" type.

Another object of this invention is to provide a solid state oscillator of the "Gunn-effect" type wherein the nucleation time of a domain is controlled.

Another object of this invention is to provide a solid state oscillator of the "Gunn-effect" type wherein the load is capacitively coupled to domains during a substantial portion of their propagation along the active region.

Another object of this invention is to provide a solid state oscillator of the "Gunn-effect" type wherein the load is not arranged in series arrangement with the active region.

BRIEF SUMMARY OF THE INVENTION

These and other objects and advantages are achieved by increasing the nucleation time of domains by loading capacitively the active region; such technique may be used independently or conjointly with prior art techniques for reducing the propagation distance L of domains along the active region. In one of the described embodiments, an epitaxial layer of n-type material defining the active region of the oscillator is formed over a p-type substrate, the output circuit comprising a load and a bias voltage source connected ohmically along the exposed surface of the substrate. A voltage source is connected across the active region of the oscillator to support the nucleation and propagation of successive domains. The pn junction between active region and substrate is reverse biased and defines a space charge region along which the load is capacitively coupled to the active region. As each domain is propagated along the active region, incremental sections of the space charge region are discharged in turn and a nearly constant capacitive current flows into the load. When a domain is extinguished, the nucleation of a subsequent domain is delayed until the capacitance associated with the space charge region is recharged and conditions necessary to support the nucleation of a domain are re-established in the active region. The capacitance associated with the space charge region is controlled, for example, by controlling the bias voltage source, such that the recharging RC time constant approximates the propagation time of a domain along the active region so as to achieve a large fundamental microwave power output. Alternatively, the load can be arranged in series with the active region of the oscillator and similar results are obtained.

DESCRIPTION OF THE PREFERRED EMBODIMENTS

Figures 2, 3, 4:
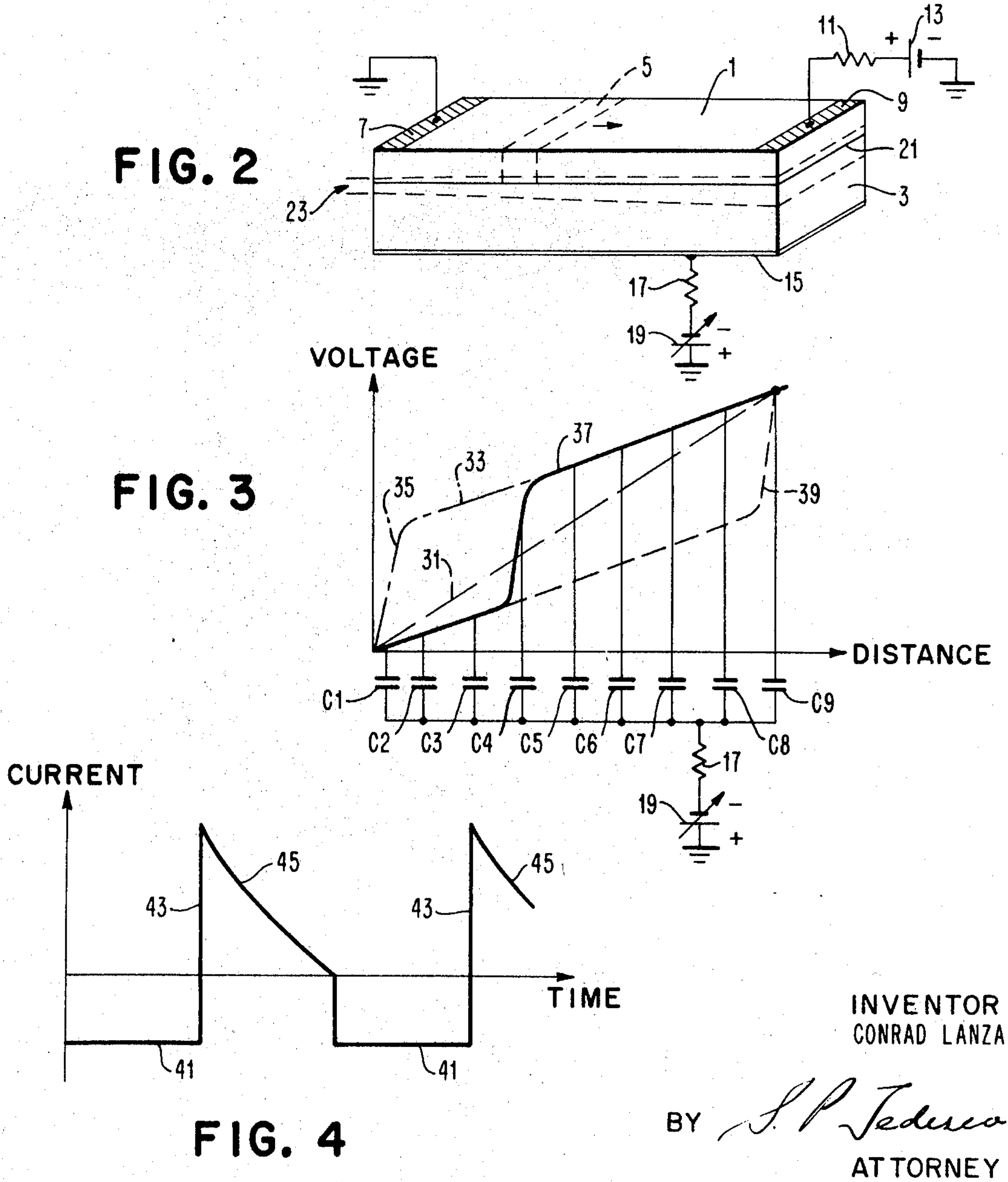
FIG. 2 illustrates preferred embodiments according to the present invention and depicts loads arranged in series with and, also, capacitively coupled to the active region of the oscillator.
FIG. 3 illustrates the potential distribution during domain propagation along the active region of the oscillator shown in FIG. 2.
FIG. 4 illustrates the current waveform produced along the load capacitively coupled along the active region of the oscillator shown in FIG. 2.

Referring to FIG. 2, a microwave oscillator in accordance with the present invention comprises a thin layer 1 of semiconductive material of single conductivity type which is epitaxially grown over a substrate 3 of opposite conductivity type. Layer 1 defines the active region of the oscillator and is formed of a selected semiconductive material having the innate property of nucleating and propagating high electric field regions, or domains 5. For example, layer 1 can be formed of n-type gallium arsenide, n-type indium phosphide, n-type indium arsenide when pressured, or n-type zinc selenide, etc. Generally, such semiconductive materials can be classified as having multivalleyed conduction band systems and wherein charge carriers are transferred from a high-mobility to a low-mobility conduction band under the influence of applied electric fields in excess of a characteristic critical intensity $E_T$. Such transfer of charge carriers results in a redistribution of electric fields within the bulk of layer 1 whereby a domain 5 is defined which propagates in the direction of carrier flow, as indicated by the arrow.

Ohmic contacts 7 and 9 are formed on a same surface of layer 1; contacts 7 and 9 can be formed by conventional alloying techniques or by n+ regions, either diffused or vapor-grown. Load 11 is connected in series with voltage source 13, the series arrangement being connected across contacts 7 and 9. Voltage source 13 is of sufficient magnitude to produce electric fields within layer 1 in excess of the critical intensity $E_T$ and support the nucleation and propagation of domains along layer 1 in successive and cyclic fashion. At such time, current flows along layer 1 and load 11 varies periodically in time in the form of coherent, sustained oscillations. The current waveform through load 11 is illustrated by the solid curve 49 of FIG. 1B, hereinafter described. The structure, as described, is a conventional solid state oscillator of the "Gunn-effect" type.

In accordance with one particular embodiment of this invention, an ohmic contact 15 is made on exposed surface of substrate 3. A load resistor 17 and a variable bias voltage source 19 is connected to contact 15. The polarity of voltage source 19 is such as to reverse bias the pn junction 21 defined between layer 1 and substrate 3 and create a space charge, or depletion region 23. It is evident that a reverse biased metal-semiconductor, or Shottky-barrier, diode could also be employed. As hereinafter described, space charge region 23 capacitively coupled load 17 to a domain 5 while such domain is propagating along layer 1. In practice, loads 11 and 17 can be resistive loads, resonant loads, etc., and can be employed individually or concurrently.

Space charge region 23 is illustrated as having a nonuniform cross-section due to the potential gradient established by voltage source 13 along layer 1 and between contacts 7 and 9. The thickness of space charge region 23 and, hence, the capacitive coupling of load 17 along layer 1 is determined by magnitude of bias voltage source 19 with respect to voltage source 13.

As illustrated, load 17 is coupled along the entire length of layer 1 along ohmic contact 15, substrate 3 and capacitively through space charge region 23 associated with the reverse biased pn junction 21. If desired, load 17 can be capacitively coupled only along a portion of layer 1 whereby the effective propagation distance L' of the successive domains 5 is reduced. Preferably, such partial capacitive coupling of load 17 is effected adjacent cathode contact 7 to provide a more positive control of the nucleation of domains 5, as hereinafter described. In practice, the current through space charge region 23 is limited to a portion of the current along layer 1 so as not to inhibit the nucleation and propagation of domains 5.

The operation of the oscillator structure of FIG. 2 is predicated upon discharging and recharging the distributed capacitance associated with space charge region 23. The discharging of such capacitance causes a nearly constant current to flow into load 17 while a propagating domain 5 is spatially coincident with such region; the recharging of such capacitance is effective to delay nucleation of a next successive domain whereby the output current waveforms along either loads 11 or 17 can be positively controlled.

Figure 1A:
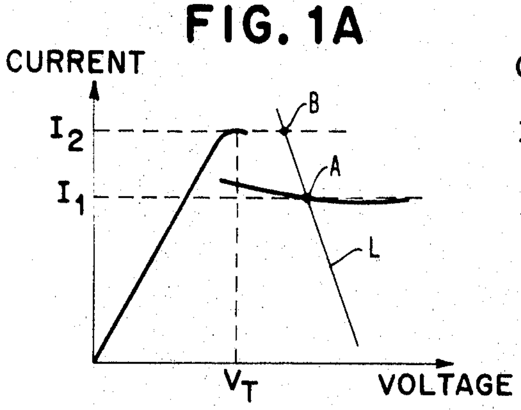
FIG. 1A illustrates typical current-voltage characteristics of a solid state oscillator of the "Gunn-effect" type.
Figure 1B:
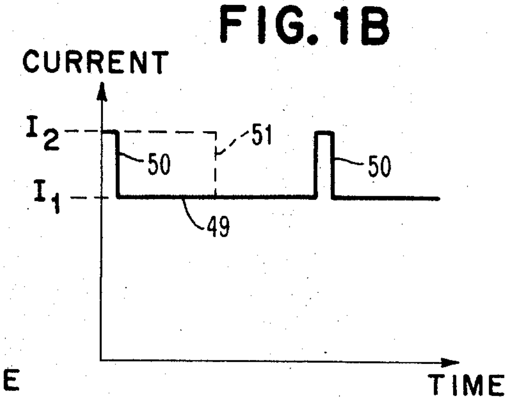
FIG. 1B illustrates the coherent current oscillations generated along a load arranged in series with such active region of such oscillator.

To understand the operation of FIG. 2, reference is made to the current-voltage characteristics shown in FIG. 1A. As the voltage applied across layer 1 by source 13 is increased from zero, current through layer 1 exhibits an essentially ohmic behavior until such voltage exceeds a critical value $V_T$ and electric fields in excess of the critical intensity $E_T$ are produced in layer 1. When electric fields exceed the critical intensity $E_T$, charge carriers are transferred to the low mobility conduction bands whereby electric fields within layer 1 are redistributed to define a domain 5. Normally, a domain 5 is nucleated adjacent to cathode contact 7 and propagates in the direction of current flow, as indicated by the arrow. Since charge carriers within domain 5 exhibit a lower mobility, that region of layer 1 supporting the domain exhibits an increased resistivity, or decreased conductance. Accordingly, a greater portion of the voltage applied by source 13 is dropped across domain 5 and current through load 11 is decreased. The current-voltage characteristic curve while a domain 5 is present in layer 1 is shown by the discontinuous portion of the curve of FIG. 1A. While a domain 5 is present in layer 1, a reduced current $I_1$ flows through load 11 as shown in FIG. 1B. While a domain 5 is absent, current $I_2$ flows along layer 1 and load 11. As domains 5 are successively propagated, therefore, two distinct current conditions, i.e., while a domain is present and absent, respectively, are obtained along layer 1 and load 11. Such current conditions are indicated by intersections A and B of DC load line L with the curve of FIG. 1A. Accordingly, the current through load 11 varies periodically in time as a series of sharp current spikes 50 so as to achieve coherent sustained current oscillations. Such current spikes are separated by relatively long time intervals determined by the propagation time of domains 5 along layer 1.

In accordance with the particular features of the present invention, microwave power output is increased substantially by capacitively loading layer 1 to delay the nucleation of successive domains 5 whereby the duration of current spikes 50 is increased. When the nucleation of domains 5 is delayed, the current waveform through each of the loads 11 and 17 more closely approximates a square wave, alternating current signal which contains a much greater fundamental microwave power than the current waveform indicated by the solid curve 49 of FIG. 1B.

FIG. 3 illustrates the potential distribution in layer 1 during the propagation of a domain 5 and FIG. 4 illustrates the resulting current waveform along load 17. In FIG. 3, the capacitance associated with space charge region 23 is schematically illustrated as a plurality of discrete capacitive segments C1 through C9. As shown in FIG. 3, the application of voltage $V_T$ would normally provide a potential distribution indicated by the dashed curve line 31, the electric field intensity along layer 1 being uniform. When electric fields within layer 1 are redistributed to define a domain 5 adjacent cathode contact 7, the potential distribution is illustrated by dashed curve 33. As a domain 5 defines a region of higher resistivity, a major portion of the voltage applied by source 13 is dropped thereacross as indicated by the steep portion 35 of curve 33, the slope of such portion being indicative of electric field intensities in excess of $E_T$ along corresponding portions of layer 1. Electric field intensity along remaining portions of layer 1 are, at least, in excess of the sustaining potential $E_S$ necessary to sustain and propagate domain 5.

When a domain 5 is nucleated adjacent cathode contact 7, each of the capacitor segments C1 through C9 is charged, the potential thereacross being determined by the relative magnitudes of sources 13 and 19. As a domain 5 propagates along layer 1, the potential across each capacitor segment C1 through C9 is reduced and each is discharged in turn. Discharging of each of the capacitor segments C1 through C9 causes current to flow into load 17, the current being supplied at a particular instant of time by that capacitor segment which is spatially coincident with domain 5.

For example, curve 37 represents the potential distribution along layer 1 when a domain 5 is propagating along an intermediate portion of layer 1. Under such conditions, domain 5 has previously swept across capacitor segments C1 through C3 which have been discharged; capacitor segments C5 through C8 are changed. However, domain 5 coincides spatially with capacitor segment C4 which experiences a change in potential thereacross and discharges through load 17. For each instant of time in which a domain 5 is propagating along layer 1, a capacitor segment is discharging and the current through load 17 is substantially constant, as illustrated by portion 41 of the current curve of FIG. 4. The magnitude of current through load 17 is related to the reactance of capacitor segments C1 through C9 in the power output circuit. As the reactance of capacitor segments C1 through C9, or space charge region 23, is dependent upon the magnitude of voltage source 19, current through load 17 can be modulated by varying voltage source 19. In practice, a varying signal source can be substituted for voltage source 19, shown as variable, to amplitude modulate the output of the oscillator.

When the domain 5 is passing out of layer 1 at anode contact 9, the potential distribution along layer 1 is shown by curve 39 of FIG. 3. At this time, each of the capacitor segments C1 through C9 are discharged. The capacitance associated with space charge region 23 must be recharged to re-establish conditions necessary to nucleate a subsequent domain 5. Accordingly, current through load 17 reverses, as indicated by portion 43 of the curve of FIG. 4, and capacitor segments C1 through C9 begin to recharge, as indicated by portion 45, along the circuit including source 19, and load 17, ohmic contact 15, substrate 3 and to ground either along cathode contact 7 or load 11 and source 13, the RC time constant of such recharging circuit determining the time required to re-establish conditions within layer 1 for nucleating a next domain 5. When space charge region 23 has recharged sufficiently whereby the potential gradient within layer 1 is approximately represented by curve 33 of FIG. 3, a subsequent domain 5 is nucleated, such operation being cyclic so as to provide a series of current pulses through load 17 as shown in FIG. 4. To maximize microwave power output, the recharging time constant of space charge region 23 is approxiamtely equal to the propagation time of domains 5 along layer 1 whereby an approximately square wave alternating current waveform is produced in load 17 as shown in FIG. 4. Also, the frequency of current oscillations along load 17 can be controlled by propagating domains 5 along only a portion of layer 1 in accordance with the teachings of the above-identified patent applications by capacitively coupling load 17 along only a portion of layer 1.

The described capacitive loading technique can be used also to obtain approximately square-wave alternating current signals in a series-connected load as exemplified by load 11 of FIG. 2. For example, referring again to FIG. 1B, the duration of a current spike 50 is determined by the time required to nucleate a domain 5. As hereinabove described, the time interval wherein current $I_2$ is supplied to load 11 can be increased by capacitively loading layer 1 to delay nucleation of a subsequent domain 5. Accordingly, a current pulse as indicated by the dashed curve 51 is generated which more closely approximates square wave alternating current whereby microwave power output is increased. It is evident that successive current pulses 51 would be separated by a time interval equal to the propagation time of domains 5 along layer 1.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A solid state device comprising
   a specimen of multivalley semiconductor material of single conductivity type and having the innate property of being responsive to electric fields in excess of a critical threshold intensity to nucleate a high electric field region and responsive to electric fields of a sustaining intensity less the said critical intensity to propagate said high electric field region,
   means for supporting normal current flow in said specimen and for establishing electric fields in said specimen to nucleate and propagate a high electric field region along said specimen, and
   means connected to said high electric field region during a substantial portion of its propagation along said specimen, said means including load means for diverting said normal current flow.

2. A solid state device as defined in claim 1 wherein said high electric field region has a thickness, less than the length of said specimen, and
   said load means is capacitively coupled along a length of said specimen greater than the thickness of said high electric field region.

3. A solid state device as defined in claim 1 wherein said high electric field region is propagated along at least a portion of said specimen.

4. A solid state device as defined in claim 1 wherein said semiconductor material is selected from the group consisting of n-type gallium arsenide, n-type indium phosphide, n-type cadmium telluride, n-type indium arsenide when pressured, and n-type zinc selenide.

5. A solid state device comprising
   a body of semiconductor material of first conductivity type and having the innate property of being responsive to electric fields in excess of a critical intensity to nucleate high electric field region and responsive to electric fields in excess of a sustaining intensity less than said threshold intensity for propagating said high electric field region when produced,
   means for supporting current flow in said body and for establishing electric fields in said body to nucleate and propagate high electric field regions in said body, and
   means capacitively connected to said body for delaying the nucleation of a domain in said body including load means for extracting power from said domain during a substantial portion of its travel through said body.

6. A solid state device as defined in claim 5 wherein said capacitively connected means is operative to delay the nucleation of a high electric field region in said body for a time approximately equal to the propagation time of said high electric field region along said body.

7. A solid state device as defined in claim 5 further including second load means serially arranged with said supporting and establishing means.

8. A solid state device as defined in claim 5 wherein said capacitively connected means includes a body of semiconductor material of second conductivity type contacting said body and defining a pn junction therewith, and means for reverse biasing said pn junction.

9. A solid state device as defined in claim 5 wherein said capacitively connected means includes a metallic member contacting said body and defining a rectifying contact therewith, and means for reverse biasing said rectifying contact.

10. A solid state device comprising
   a body of semiconductive material of single conductivity type and having the innate property of nucleating a high electric field region in response to electric fields in excess of a critical intensity and propagating high electric fields in response to electric fields in excess of a sustaining intensity less than said critical intensity,
   voltage means ohmically connected across said body for supporting current flow along said body and for establishing electric fields in said body to nucleate and propagate high electric field regions along said body in cyclic fashion,
   rectifying contact means along one surface of said body and extending at least along a portion of the propagating path of said high electric field regions along said body, and
   means for reverse biasing said rectifying contact means so as to capacitively load said body and delay the nucleation of said high electric field regions in said body, said reverse biasing means including a load means continually coupled to said propagating regions along a substantial portion of travel of said regions along said body.

11. A solid state device as defined in claim 10 wherein said reverse biasing means includes a variable voltage source to control the nucleation delay of said high electric field regions.

12. A solid state device as defined in claim 11 wherein said reverse biasing means includes a voltage source, the magnitude of said voltage source being such as to delay the nucleation of said high electric field regions for a time approximately equal to the propagation time of said high electric field regions along said portion of said body.

13. A solid state device as defined in claim 11 wherein said rectifying contact means is defined by a Shottky-barrier.

14. A solid state device as defined in claim 11 wherein said rectifying contact is defined by a pn junction.

15. A solid state device as defined in claim 11 wherein said voltage means includes load means.

References Cited

UNITED STATES PATENTS 3,365,583 1/1968 Gunn ---------------- 331—107

OTHER REFERENCES

Electronics, pp. 49, 50, (1966).

JOHN KOMINSKI, Primary Examiner

U.S. Cl. X.R.

317—234